(12) United States Patent
Lee et al.

(10) Patent No.: US 11,500,068 B2
(45) Date of Patent: Nov. 15, 2022

(54) LIDAR APPARATUS FOR VEHICLE

(71) Applicant: LG Electronics Inc., Seoul (KR)

(72) Inventors: Yonghyun Lee, Seoul (KR); Sunghoon Cha, Seoul (KR); Jejong Lee, Seoul (KR); Gyujin Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 983 days.

(21) Appl. No.: 16/242,580

(22) Filed: Jan. 8, 2019

(65) Prior Publication Data

US 2019/0212418 A1   Jul. 11, 2019

Related U.S. Application Data

(60) Provisional application No. 62/615,174, filed on Jan. 9, 2018.

(51) Int. Cl.
| | |
|---|---|
| *G01S 7/48* | (2006.01) |
| *G01S 7/481* | (2006.01) |
| *G01S 17/42* | (2006.01) |
| *G01S 17/931* | (2020.01) |
| *H05K 1/02* | (2006.01) |
| *H05K 1/14* | (2006.01) |

(52) U.S. Cl.
CPC ............ *G01S 7/4816* (2013.01); *G01S 7/481* (2013.01); *G01S 7/4813* (2013.01); *G01S 7/4814* (2013.01); *G01S 7/4817* (2013.01); *G01S 17/42* (2013.01); *G01S 17/931* (2020.01); *H05K 1/0203* (2013.01); *H05K 1/14* (2013.01)

(58) Field of Classification Search
CPC ...... G01S 7/4816; G01S 7/481; G01S 7/4817; H05K 1/0203; H05K 1/14
See application file for complete search history.

(56) References Cited

U.S. PATENT DOCUMENTS 6,957,775 B2 * 10/2005 Tsikos .................... G06Q 30/00
235/472.01

FOREIGN PATENT DOCUMENTS

| KR | 1020100107164 | 10/2010 |
| KR | 1020160034719 | 3/2016 |
| KR | 101814129 | 1/2018 |
| WO | 2016153233 | 9/2016 |

OTHER PUBLICATIONS

Kasturi et al., "UAV-Borne LiDAR with MEMS Mirror Based Scanning Capability," Mirrorcle Technologies, Inc., SPIE Defense and Commercial Sensing Conference 2016, Baltimore, MD, Apr. 20, 2016, 10 pages.

* cited by examiner

*Primary Examiner* — Tony Ko
(74) *Attorney, Agent, or Firm* — Fish & Richardson P.C.

(57) ABSTRACT

A lidar apparatus includes a sensor configured to convert light into an electrical signal, a light receiving lens configured to receive light and to guide the received light toward the sensor, a lens barrel that supports the light receiving lens, a micro-electromechanical systems (MEMS) mirror arranged at a first position in which the MEMS mirror defines a first plane that forms a first acute angle with respect to at least one surface of the lens barrel, and a light output device that is configured to output a laser light toward the MEMS mirror and that is arranged at a second position in which the light output device defines a second plane that forms a second acute angle with respect to the at least one surface of the lens barrel.

20 Claims, 13 Drawing Sheets

LIDAR APPARATUS FOR VEHICLE

CROSS-REFERENCE TO RELATED APPLICATION

This application claims the priority benefit of U.S. Provisional Patent Application No. 62/615,174, filed on Jan. 9, 2018, the disclosure of which is incorporated herein by reference.

TECHNICAL FIELD

The present disclosure relates to a lidar apparatus for a vehicle.

BACKGROUND

A vehicle is an apparatus that can transport a user in a direction in which the user wants to go. One example of the vehicle may be a car.

In some examples, for the convenience of vehicle users, the vehicle may include various sensors and electronic devices. For instance, for the convenience of user's driving, research into an advanced driver assistance system (ADAS) and autonomous vehicles has been actively conducted. In some examples, for the ADAS or an autonomous driving function in a vehicle, various sensors may be installed in the vehicle to acquire information on an object located around the vehicle.

In some cases, a vehicle may include a Light Detection and Ranging (lidar) apparatus among various sensors for detecting an object located outside. The lidar apparatus among various components of the vehicle, may be desired to have a compact size in consideration of a limited installation space and for the purpose of avoiding intervention with other components. In some cases, the lidar apparatus may be a component of the vehicle to be used for years, and thus, durability is desired for the lidar apparatus.

SUMMARY

The present disclosure provides a lidar apparatus for a vehicle, which is manufactured in a compact size and has durability.

According to one aspect of the subject matter described in this application, a lidar apparatus includes a sensor configured to convert light into an electrical signal, a light receiving lens configured to receive light and to guide the received light toward the sensor, a lens barrel that supports the light receiving lens, a micro-electromechanical systems (MEMS) mirror arranged at a first position in which the MEMS mirror defines a first plane that forms a first acute angle with respect to at least one surface of the lens barrel, and a light output device that is configured to output a laser light toward the MEMS mirror and that is arranged at a second position in which the light output device defines a second plane that forms a second acute angle with respect to the at least one surface of the lens barrel.

Implementations according to this aspect may include one or more of the following features. For example, the light output device may include a laser diode configured to generate first light, a collimator lens configured to convert the first light into a parallel light, and a cylindrical lens configured to convert the parallel light into a line light. In some examples, the MEMS mirror is configured to reflect the line light in one or more directions along a scanning direction corresponding to a horizontal direction of the lens barrel.

In some implementations, the lidar apparatus may further include a first Printed Circuit Board (PCB) that is arranged on the MEMS mirror, where the first PCB includes at least one power supply element mounted thereon. In some examples, the light receiving lens may include a first lens that protrudes forward from a side of the lidar apparatus, where the lens barrel may include a first portion located rearward of the first lens, and a protrusion part that protrudes forward from the first portion and that supports the first lens of the light receiving lens. A front-to-rear length of the first PCB may correspond to a front-to-rear length of the first portion of the lens barrel.

In some implementations, the lidar apparatus may further include a first heat sink that is arranged on the first PCB that includes a plurality of radiation pins exposed in an upward direction of the lens barrel. In some examples, the first heat sink has a shape corresponding to a shape of the first PCB. In some implementations, the lidar apparatus may include a second PCB that is arranged in a direction orthogonal to the first PCB and that includes at least one processing element mounted thereon. In some implementations, the lidar apparatus may further include a second heat sink that is vertically arranged at a rear surface of the second PCB and that includes a plurality of radiation pins exposed in a backward direction of the lens barrel.

In some implementations, the lidar apparatus may further include a Flexible Printed Circuit Board (FPCB) that is configured to electrically connect the second PCB and the light output device to each other. In some implementations, the lidar apparatus may further include a mirror support that is configured to support the MEMS mirror and the light output device, where at least a portion of the FPCB surrounds the mirror support. In some examples, at least a portion of the FPCB may be configured to contact at least one surface of the lens barrel.

In some implementations, the lidar apparatus may further include a third heat sink that is vertically arranged at a rear surface of the sensor and that includes a plurality of radiation pins that extend in a vertical direction with respect to a front-to-rear direction of the lens barrel. In some examples, the plurality of radiation pins of the third heat sink may be exposed in an upward direction of the lens barrel and a downward direction of the lens barrel.

In some implementations, the lidar apparatus may further include a fourth heat sink that contacts at least a portion of the light output device and that includes a plurality of radiation pins exposed in a forward direction of the lens barrel.

In some implementations, the lidar apparatus may further include a case that defines an exterior appearance of the lidar apparatus and that is configured to accommodate the sensor, the lens barrel, the MEMS mirror, and the light output device, the case defining at least one opening. In some examples, the lidar apparatus may further include a window cover that is configured to cover the at least one opening and that includes a filter that allows light reflected from the MEMS mirror to pass therethrough.

In some implementations, the lidar apparatus may further include at least one heat sink, where the at least one opening defined in the case may include a heat sink opening that is configured to expose radiation pins of the at least one heat sink. In some examples, the case may have a rectangular cuboid shape having six surfaces, where the at least one heat sink may include a plurality of heat sinks, and the at least one opening may include a plurality of openings that are located at four surfaces among the six surfaces of the case and that are configured to expose radiation pins of the plurality of heat sinks. In some examples, at least one of a width, a length, or an area of the case may correspond to at least one of a width, a length, or an area of the at least one heat sink, respectively.

The details of various implementations are included in the following description and the accompanying drawings.

According to the present disclosure, in some scenarios there may be one or more advantageous effects as follows.

First, as a lidar apparatus is provided in a more compact size, a more space for other components may be secured in a vehicle manufacturing process.

Second, as a heat sink corresponding to each component is included, heat may be managed efficiently, improving durability of the lidar apparatus.

Third, as a one dimensional (1D) Micro-Electro-Mechanical System (MEMS) mirror is used, an object may be detected more robustly compared to the case where a two dimensional (2D) MEMS mirror is used, improving durability of the lidar apparatus.

Effects of the present disclosure are not be limited to the aforementioned effects and other unmentioned effects may results from implementations of the present disclosure.

BRIEF DESCRIPTION OF THE DRAWINGS

The implementations will be described in detail with reference to the following drawings in which like reference numerals refer to like elements.

DETAILED DESCRIPTION

Figure 1:
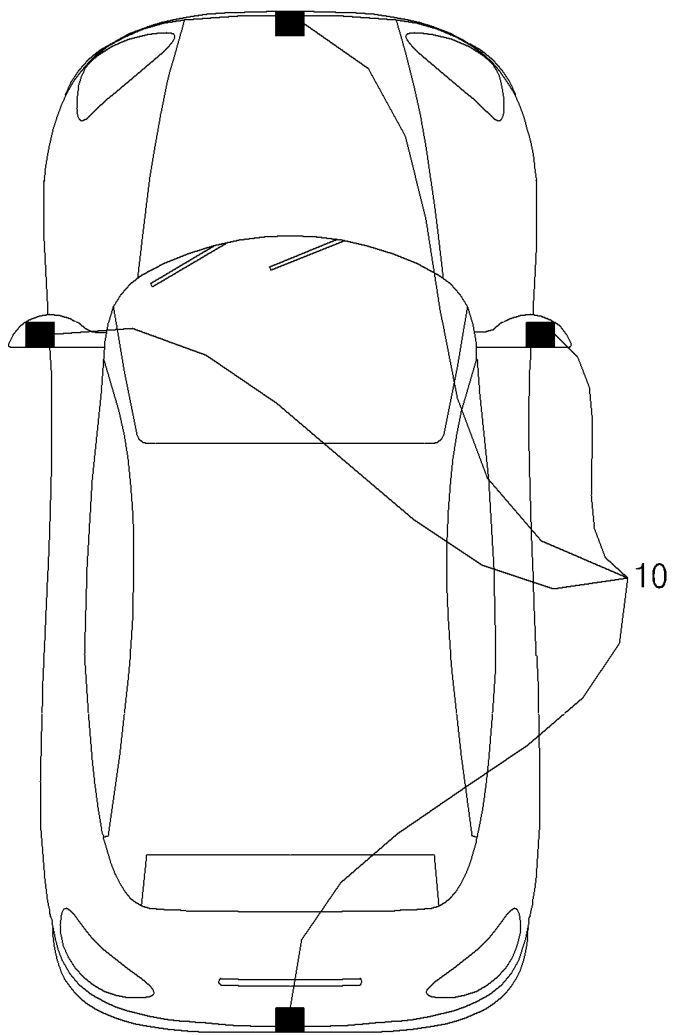
FIG. 1 is a diagram illustrating an example lidar apparatus for a vehicle.

Hereinafter, the implementations disclosed in the present specification will be described in detail with reference to the accompanying drawings, and the same or similar elements are denoted by the same reference numerals even though they are depicted in different drawings and redundant descriptions thereof will be omitted.

A vehicle described in this specification may include, but is not limited to, an automobile and a motorcycle. Hereinafter, a description will be given based on an automobile.

A vehicle as described in this specification may include one or more of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

FIG. 1 is a diagram illustrating an example lidar apparatus for a vehicle.

A vehicle 1 may include at least one lidar apparatus 10. For example, the vehicle 1 may include a first lidar apparatus configured to output light forward, a second lidar apparatus configured to output light backward, a third lidar apparatus configured to output light leftward, and a fourth lidar apparatus configured to output light rightward.

The lidar apparatus 10 may detect an object located outside the vehicle 1. The lidar apparatus 10 may detect an object based on a Time of Flight (TOF) or a phase-shift by use of output light, and detect a location of the detected object, a distance to the detected object, and a speed relative to the detected object.

Figure 2:
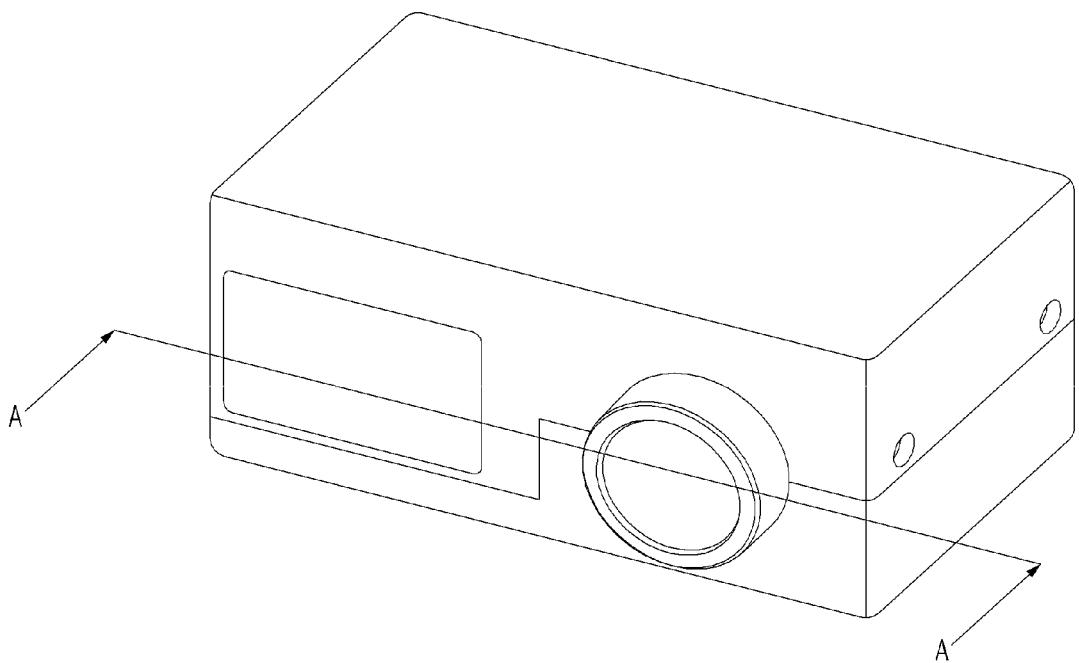
FIG. 2 is a diagram illustrating an example exterior appearance of an example lidar apparatus for a vehicle.
Figure 2:
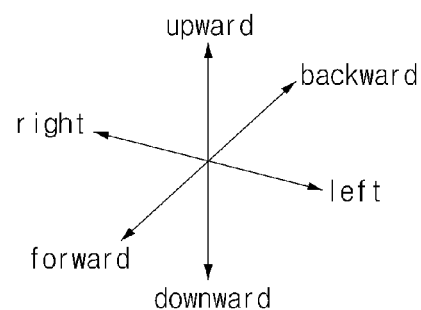

FIG. 2 is a diagram illustrating an example exterior appearance of an example lidar apparatus for a vehicle.

Figure 3:
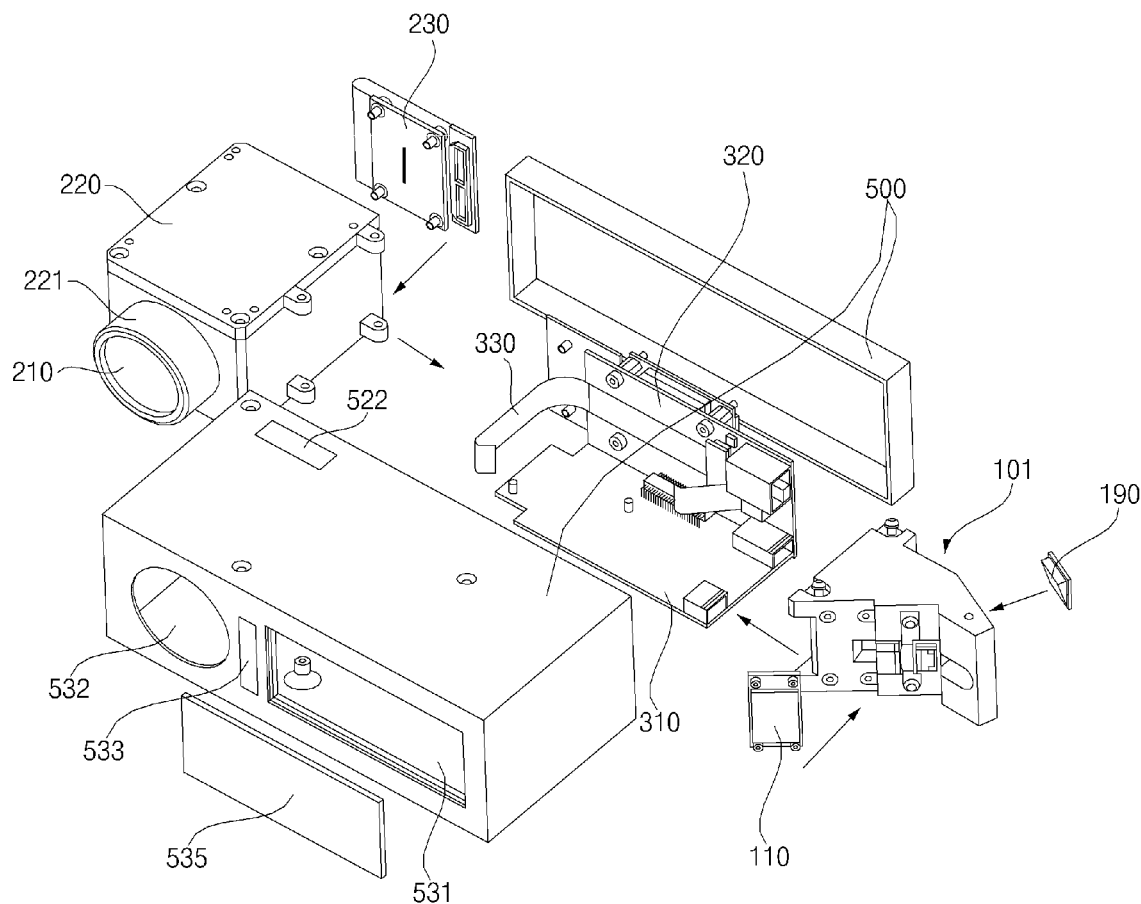
FIG. 3 is an exploded perspective view of an example lidar apparatus for a vehicle.
Figure 3:
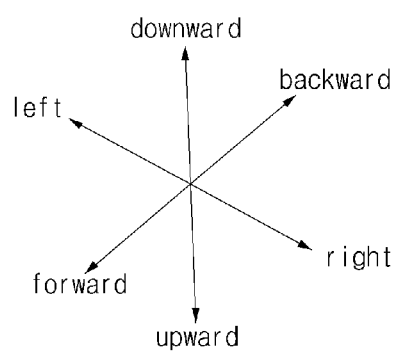

FIG. 3 is an exploded perspective view of an example lidar apparatus for a vehicle.

Figure 4A:
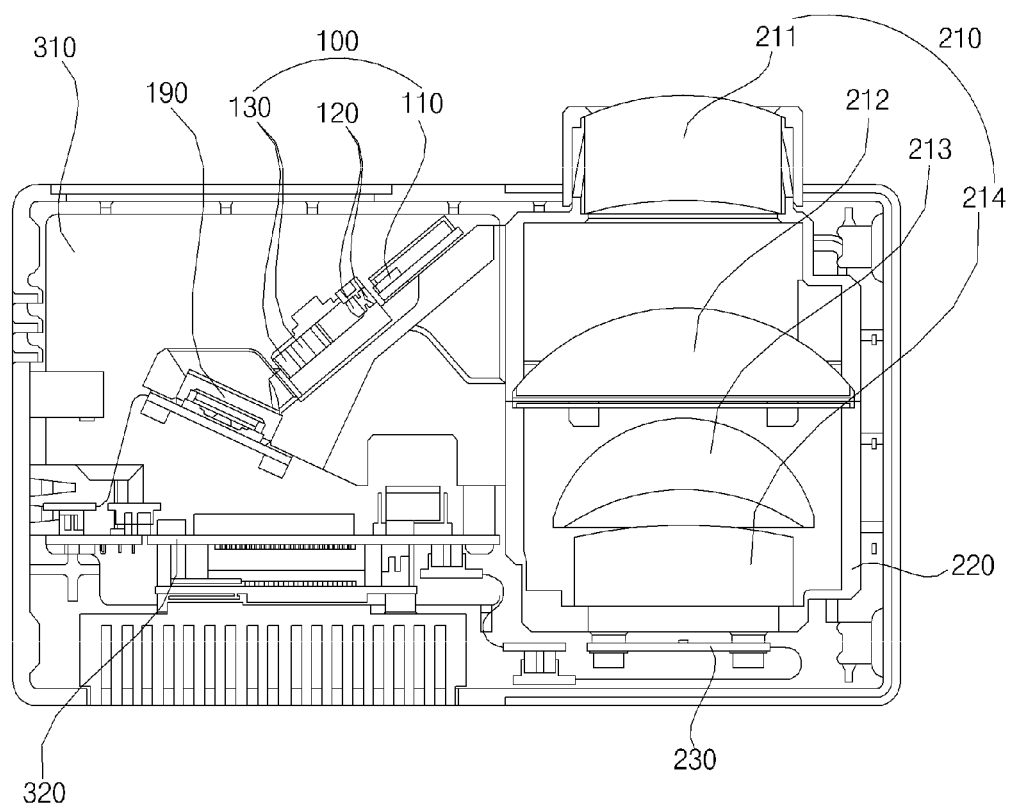
FIG. 4A is a cross-sectional view of the example lidar apparatus cut along the line A-A shown in FIG. 2.
Figure 4A:
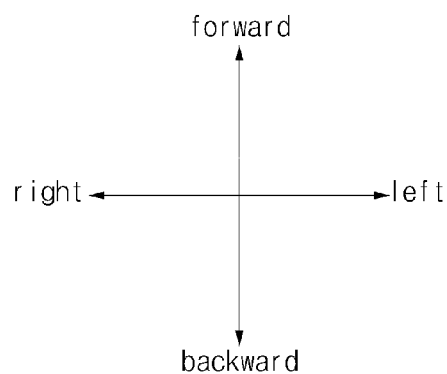

FIG. 4A is a cross-sectional view of the example lidar apparatus cut along line A-A shown in FIG. 2.

Figure 4B:
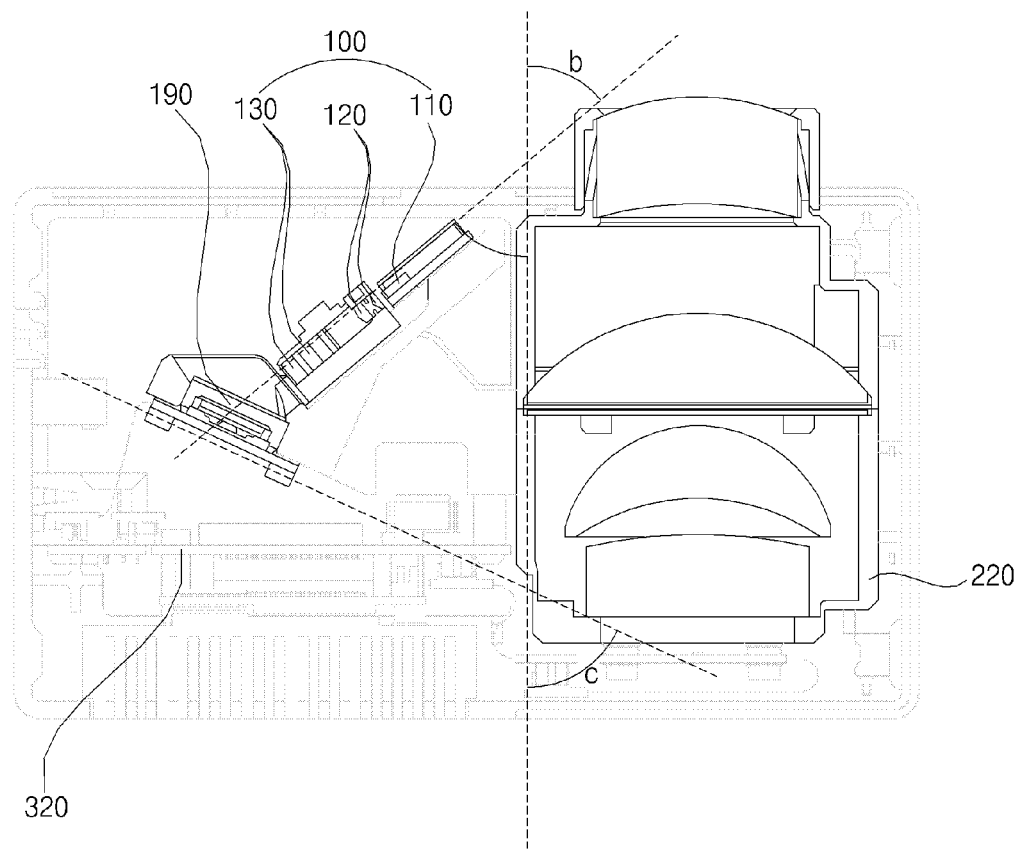
FIG. 4B is a diagram illustrating example positions of an example light output device and an example MEMS mirror in FIG. 4A.
Figure 4B:
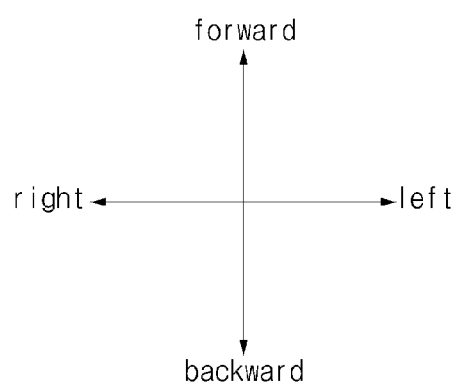

FIG. 4B is a diagram illustrating example positions of an example light output device and an example MEMS mirror in FIG. 4A.

Figure 5:
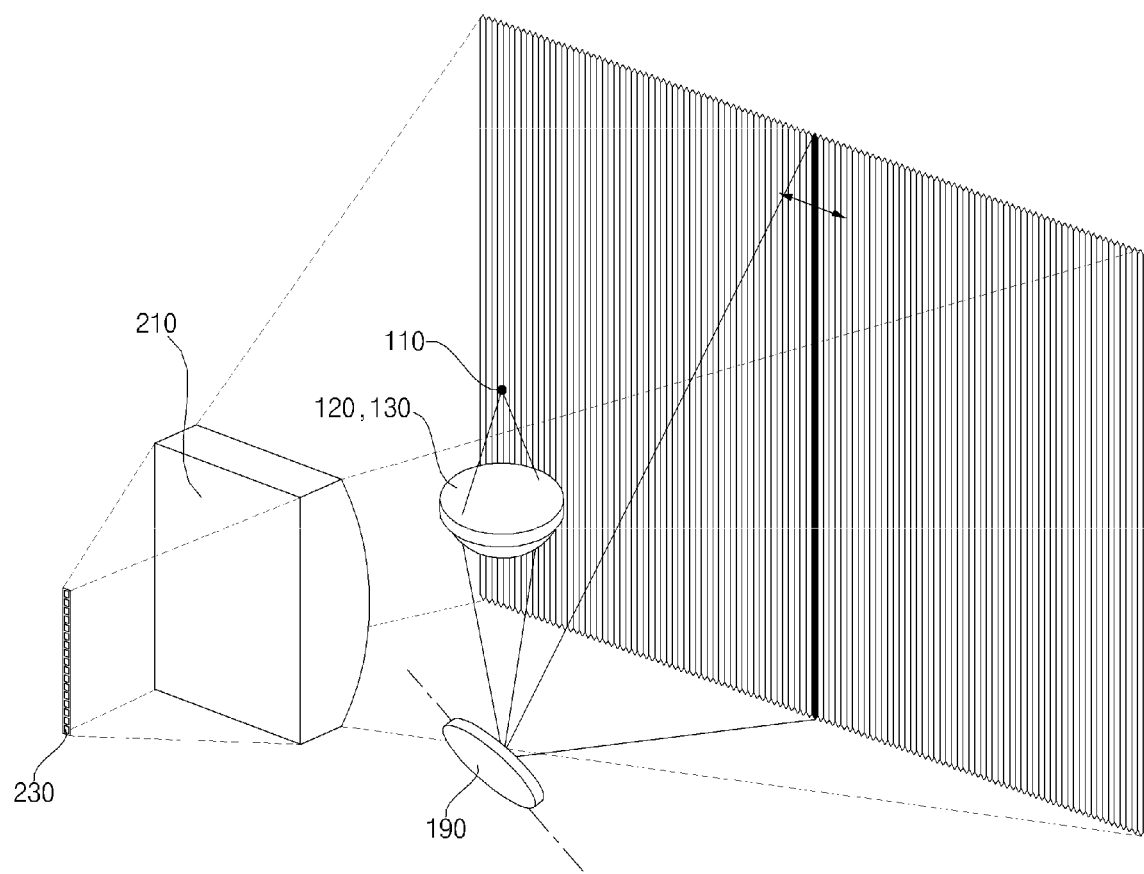
FIG. 5 is a diagram illustrating an example scanning operation performed by an example lidar apparatus for a vehicle.

FIG. 5 is a diagram illustrating an example scanning operation performed by an example lidar apparatus for a vehicle.

Figure 6:
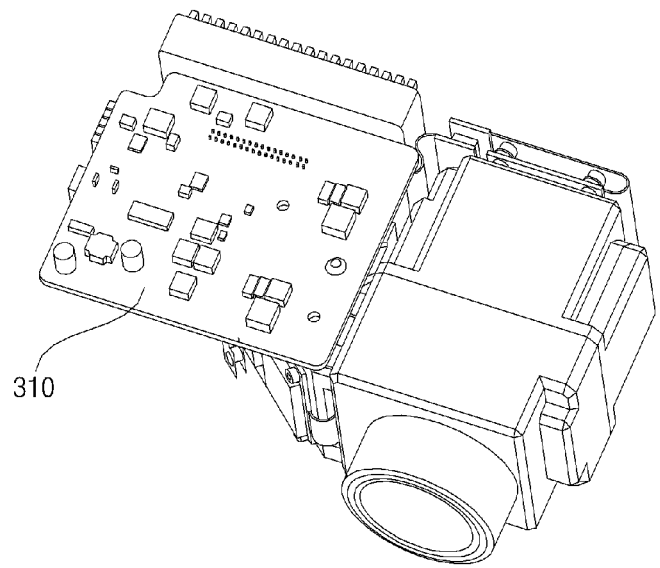
FIGS. 6 to 8 are diagrams illustrating an example lidar apparatus.
Figure 6:
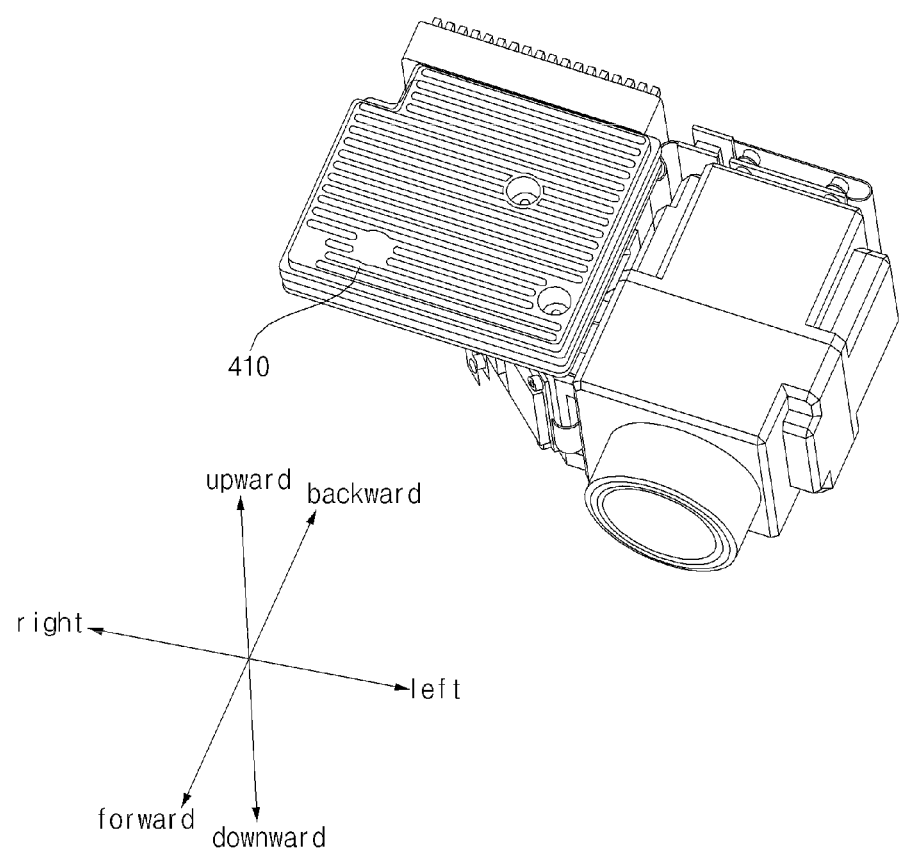
Figure 7:
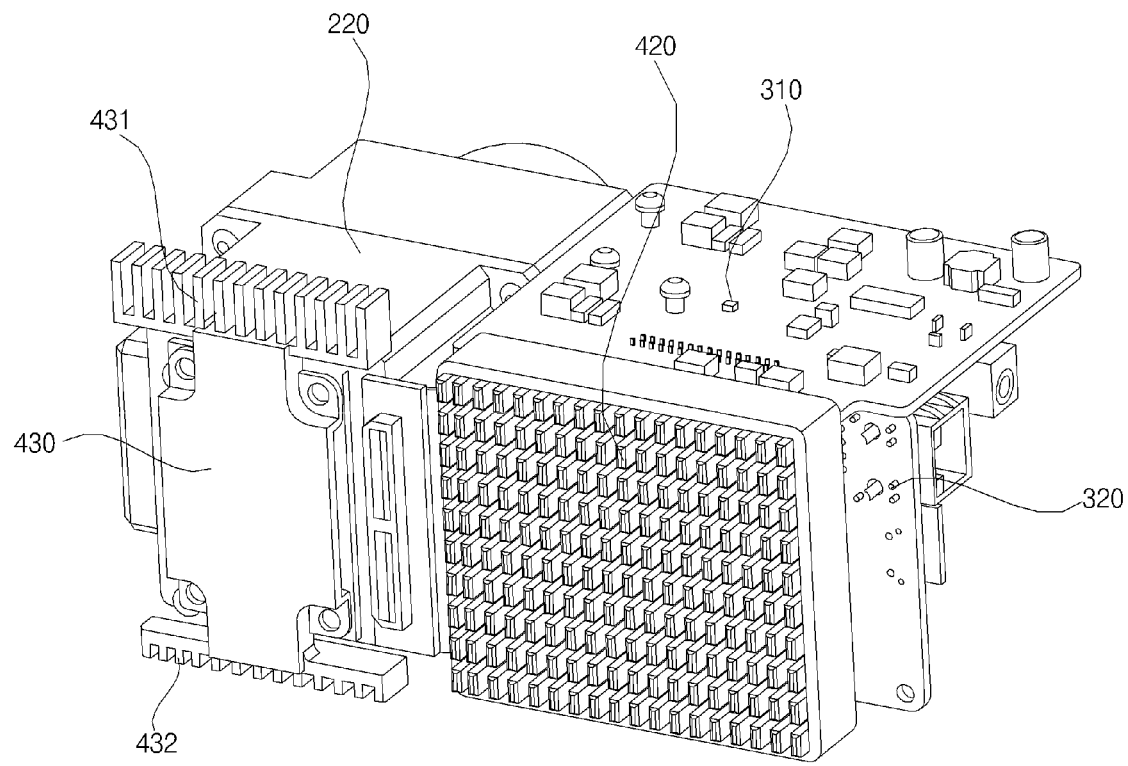
Figure 7:
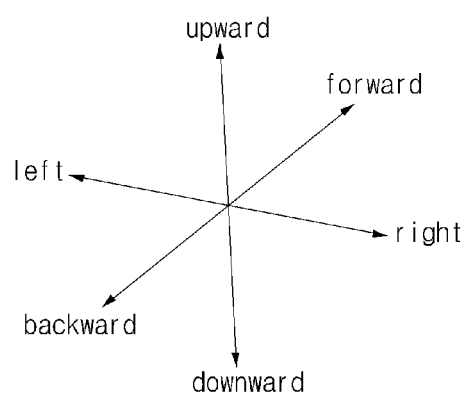
Figure 8:
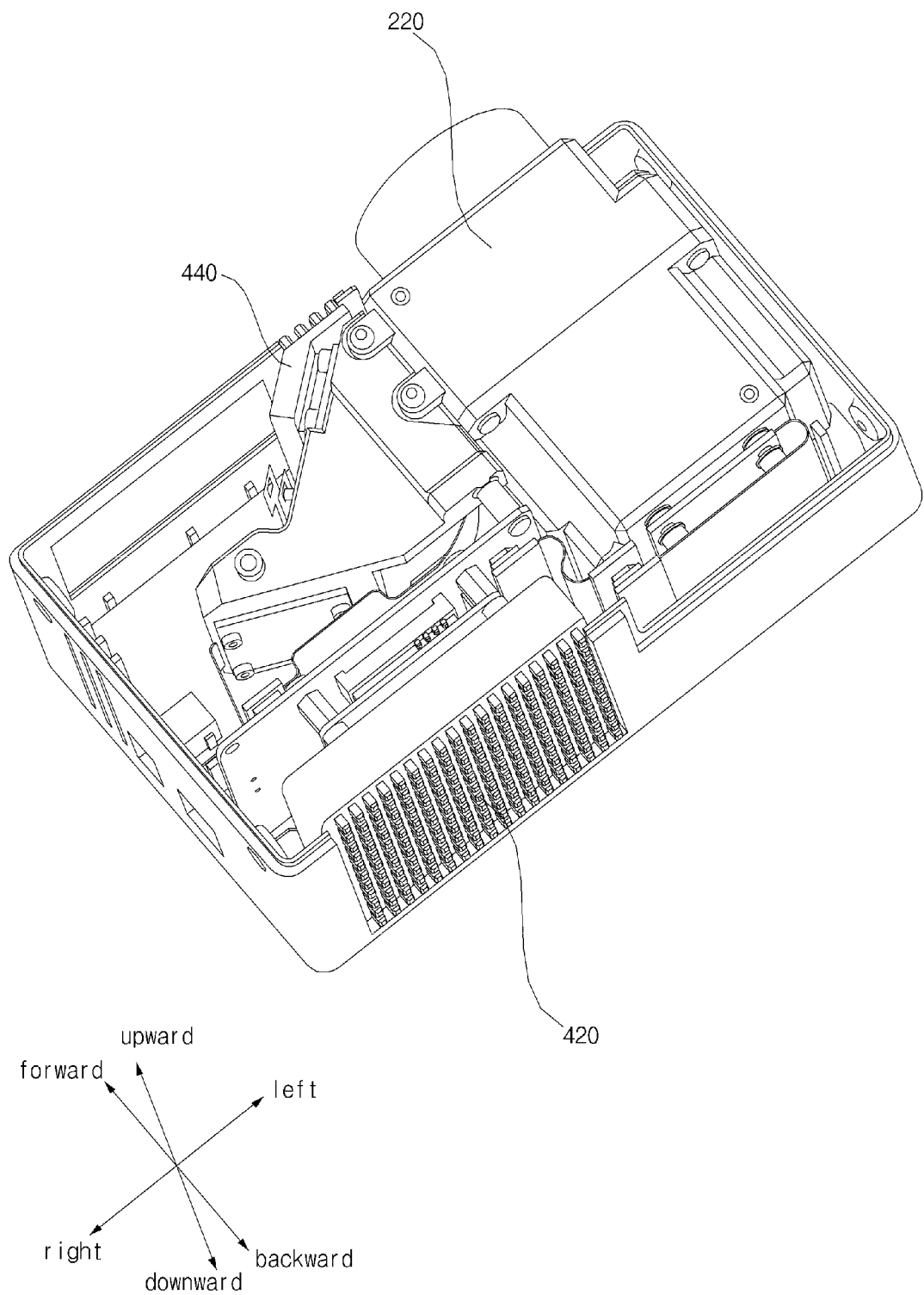
Figure 9A:
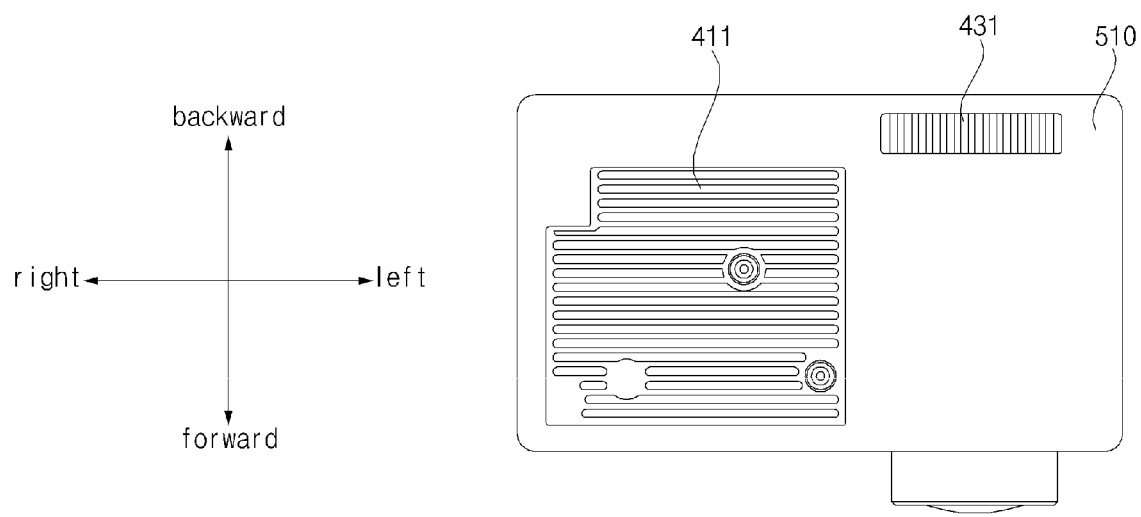
FIGS. 9A to 9D are diagrams illustrating an example lidar apparatus for a vehicle viewed from various angles.
Figure 9B:
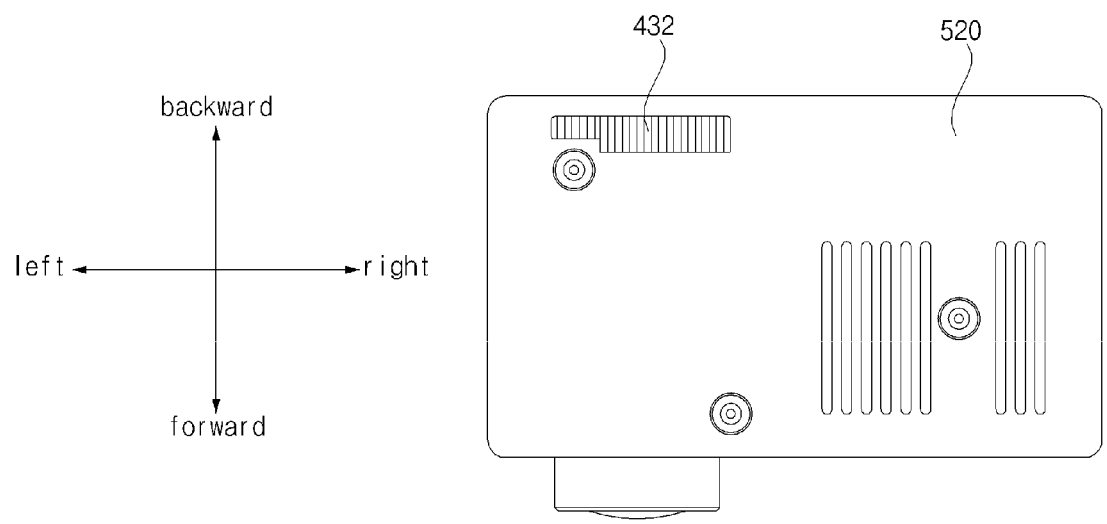
Figure 9C:
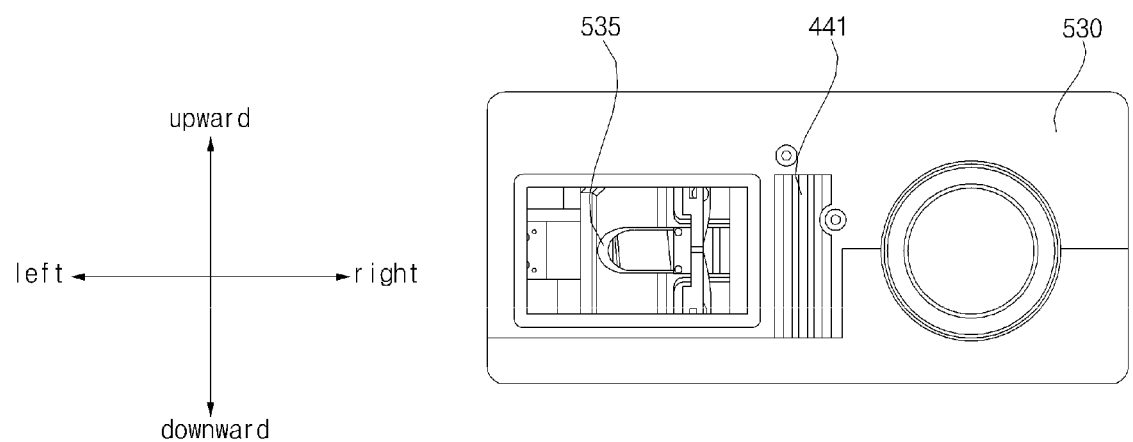
Figure 9D:
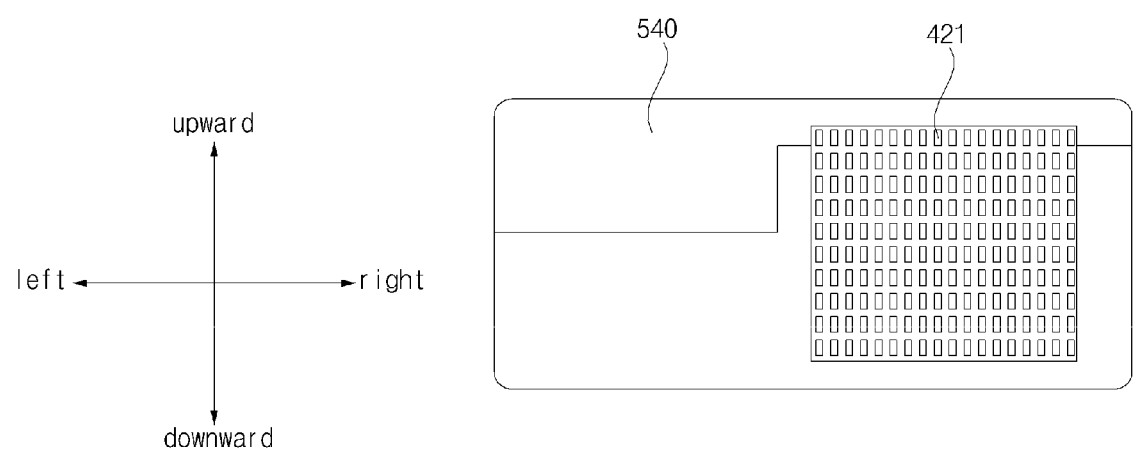

FIGS. 6 to 8 are diagrams illustrating an example lidar apparatus.

FIGS. 9A to 9D are diagrams illustrating an example lidar apparatus for a vehicle viewed from various angles.

In some implementations, the lidar apparatus 10 may include a light output device 100, a MEMS mirror 190, a mirror support 101, a light receiving lens 210, a lens barrel 220, a sensor 230, a first Printed Circuit Board (PCB) 310, a second PCB 320, a Flexible Printed Circuit Board (FPCB) 330, a plurality of heat sinks 410, 420, 430, and 440, and a case 500.

The light output device 100 may generate light. The light output device 100 may output a laser light in an infrared wavelength band which is not harmful to a human body. The light output device 100 may output a light within an extent that the light is not harmful to a human body. The light output device 100 may output the generated laser ray toward the MEMS mirror 190.

The light output device 100 may have an approximate rod shape. The light output device 100 may include a laser diode 110, at least one collimator lens 120, and at least one cylindrical lens 130. The light output device 100 may include a rod-shaped case, and the laser diode 110, the at least one collimator lens 120, and the at least one cylindrical lens 130 may be arranged in order named within the case 500.

Referring to FIG. 4B, the light output device 100 in a rod shape may be arranged in a position in which the light output device 100 forms an acute angle b with at least one surface of the lens barrel 220. For example, the light output device 100 may be arranged in a position in which an extending direction of the light output device 100 forms an acute angle with an extending direction of the lens barrel 220, when viewed from top or bottom. With such arrangement, a compact-sized lidar apparatus for a vehicle may be implemented.

A light generated by the laser diode 110 may be provided to the MEMS mirror 910 through the at least one collimator lens 120 and the at least one cylindrical lens 130. The light output device 100 may provide a line light to the MEMS mirror 190. The at least one collimator lens 120 may convert a light generated by the laser diode 110 into a parallel light. The at least one cylindrical lens 130 may convert the parallel light having passed the at least one collimator lens 120 into a line light.

The MEMS mirror 190 may reflect a light provided from the light output device 100 to the outside of the vehicle 1. The MEMS mirror 190 may reflect the light according to a preset field of view (FOV) while scanning the light in a particular direction. The MEMS mirror 190 may scan a line light in a horizontal direction. For example, if the lidar apparatus 10 is installed at the front of the vehicle 1, the MEMS mirror 190 may reflect a light in a direction forward of the vehicle 1 while scanning the light. For example, if the lidar apparatus 10 is installed at the rear of the vehicle 1, the MEMS mirror 190 may reflect a light in a direction backward of the vehicle 1 while scanning the light. For example, if the MEMS mirror 190 is installed on the left side of the vehicle 1, the MEMS mirror 190 may reflect a light in a direction leftward of the vehicle 1 while scanning the light. For example, if the lidar apparatus is installed on the right side of the vehicle 1, the MEMS mirror 190 may reflect a light in a direction rightward of the vehicle 1 while scanning the light.

Referring to FIG. 4B, the MEMS mirror 190 may be arranged in a position in which the MEMS mirror 190 forms an acute angle c with at least one surface of the lens barrel 220. For example, the MEMS mirror 190 may be arranged in a position in which a right-to-left extending direction of the MEMS mirror 190 forms an acute angle with an extending direction of the lens barrel 220. With such arrangement, a compact-sized lidar apparatus for a vehicle may be implemented.

The mirror support 101 may support the MEMS mirror 190 and the light output device 100. With the MEMS mirror 190 and the light output device 100 being coupled to each other, the mirror support 101 may be coupled to another component of the lidar apparatus 10. In order to maintain an optical path, the mirror support 101 may hold the laser diode 110, the at least one collimator lens 120, and the at least one cylindrical lens 130 in place.

In some implementations, the mirror support 101, the light output device 100, and the MEMS mirror 190 may be classified as subordinate components of a transmitter. The transmitter may be defined as a device configured to output light to the outside of the vehicle 1.

The light receiving lens 210 may guide a reflected light toward the sensor 230. The reflected light may refer to a laser light which is output by the light output device 100 and then reflected by an object located outside the vehicle 1. The light receiving lens 210 may be provided in plurality. The light receiving lens 210 may be supported by the lens barrel 220.

The lens barrel 220 may support the light receiving lens 210. Referring to FIG. 3, the lens barrel 220 may have an approximate cuboid shape. The lens barrel 220 may include a protruding part 221 protruding from one surface of the cuboid shape. The protruding part 221 may be formed in an approximate cylindrical shape. The protruding part 221 may support a first lens included in the light receiving lens 210. The protruding part 221 may be exposed to the outside of the lidar apparatus 10 through a second opening 532 formed on one surface of the case 500.

The sensor 230 may convert a reflected light into an electrical signal. The sensor 230 may include at least one photodiode. The sensor 230 may be formed in 1D array in which a plurality of photodiodes are aligned in a straight line. Since an output light takes a form of a line light, the reflected light takes a form of a line light, and thus, an object may be detected using the sensor 230 which constitutes the 1D array.

The light receiving lens 210, the lens barrel 220, and the sensor 230 may be classified as subordinate components of a receiver. The receiver may be defined as a device that receives light reflected by an object.

At least one power supply element may be mounted onto the first PCB 310. The at least one power supply element may be supplied with power from a battery of the vehicle 1, and supply the power to each unit of the lidar apparatus 10. The first PCB 310 may be electrically connected to the light output device 100, the MEMS mirror 190, and the second PCB 320. The at least one power supply element installed onto the first PCB 310 may be electrically connected to the light output device 100, the MEMS mirror 190, the second PCB 320, and the sensor 230.

The first PCB 310 may be horizontally arranged on the MEMS mirror 190. The first PCB 310 may be horizontally arranged in proximity to a top surface or a bottom surface of the case 500.

In some examples, a front-to-rear length of the first PCB 310 may correspond to a front-to-rear length of the lens barrel 220 except the protruding part 221, which supports the first lens 211. For example, the front-to-rear length of the first PCB 310 may be equal to the front-to-rear length of the lens barrel 220 except the protruding part 221.

At least one processing element may be mounted onto the second PCB 320. The at least one processing element may include at least one of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, ROMs, RAMS, EPROMs, flash drives, or hard drives. The second PCB 320 may be electrically connected to the light output device 100, the MEMS mirror 190, the first PCB 310, and the sensor 230. The at least one processing element may control the light output device 100, the MEMS mirror 190, and the sensor 230. The at least one processing element may perform computer processing based on an electrical signal generated by the sensor 230.

The second PCB 320 may be arranged vertically to the first PCB 310. The second PCB 320 may be arranged vertically in proximity to the rear surface of the case 500.

Due to the characteristics in arrangement of the first PCB 310 and the second PCB 320, the lidar apparatus 10 may be manufactured in a more compact size.

The FPCB 330 may electrically connect the second PCB 320 and the light output device 100 with each other. At least a portion of the FPCB 330 may be arranged to surround the mirror support 101. At least a portion of the FPCB 330 may come into contact with at least one surface of the lens barrel 220.

The plurality of heat sinks 410, 420, 430, and 440 may emit heat, generated in the lidar apparatus 10, to the outside. Each of the plurality of heat sinks 410, 420, 430, and 440 may include radiation pins. The respective radiation pins included in the plurality of heat sinks 410, 420, 430, and 440 may be exposed in four directions from the lidar apparatus 10. At least one of an area, a width, or a length of each of the plurality of heat sinks 410, 420, 430, and 440 may correspond to any of a width, a length, and an area of the case 500. The plurality of heat sinks 410, 420, 430, and 440 may include a first heat sink 410, a second heat sink 420, a third heat sink 430, and a fourth heat sink 440.

Referring to FIG. 6, the first heat sink 410 may be horizontally arranged on the first PCB 310. The first heat sink 410 may include a plurality of radiation pins exposed in an upward direction. The first heat sink 410 may have a shape corresponding to a shape of the first PCB 310. For example, if the first PCB 310 has a rectangular shape having bent edge portions, the first heat sink 410 may have an area similar to an area of the first PCB 310 and a rectangular shape having bent edge portions. The first heat sink 410 may emit heat, generated in the first PCB 310, to the outside of the lidar apparatus 10. The first heat sink 410 may come into contact with at least a portion of the first PCB 310. According to an implementation, the first heat sink 410 may come into contact with at least a portion of the first PCB 310 through a thermal pad.

Referring to FIG. 7, the second heat sink 420 may be vertically arranged at the rear of the second PCB 320. The second heat sink 420 may include a plurality of radiation pins exposed in a backward direction. The second heat sink 420 may have a shape corresponding to a shape of the second PCB 320. For example, if the second PCB 320 has a rectangular shape, the second heat sink 420 may have a rectangular shape with an area similar to an area of the second PCB 320. The second heat sink 420 may emit heat, generated in the second PCB 320, to the outside of the lidar apparatus 10. The second heat sink 420 may come into contact with at least a portion of the second PCB 320. According to an implementation, the second heat sink 420 may come into contact with at least a portion of the second PCB 320 through a thermal pad.

Referring to FIG. 7, the third heat sink 430 may be arranged at the rear of the sensor 230. The third heat sink 430 may include a plurality of radiation pins extending in a direction vertical to a front-to-rear extending direction of the lens barrel 220. The plurality of radiation pins included in the third heat sink 430 may be exposed in upward and downward directions. The third heat sink 430 may prevent a change in performance of sensor 230 by temperature. The third heat sink 430 may come into contact with the sensor 230 or a PCB on which the sensor 230 is mounted onto. According to an implementation, the third heat sink 430 may come into contact with the sensor 230 or the PCB, on which the sensor 230 is mounted onto, through a thermal pad.

Referring to FIG. 8, the fourth heat sink 440 may come into contact with at least a portion of the light output device 100. The fourth heat sink 440 may include a plurality of radiation pins exposed in a forward direction. The fourth heat sink 440 may prevent a change in performance of the laser diode 110 caused by temperature. The fourth heat sink 440 may come into contact with the laser diode 110 or a PCB onto which the laser diode 110 is mounted. According to an implementation, the fourth heat sink 440 may come into contact with the laser diode 110 or the PCB, onto which the laser diode 110 is mounted, through a thermal pad.

Referring to FIGS. 3 and 9A to 9D, the case 500 may define the exterior appearance of the lidar apparatus 10. According to an implementation, if the case 500 is composed of a plurality of parts coupled thereto, the case 500 may form the exterior appearance of the lidar apparatus 10. The case may accommodate the sensor 230, the lens barrel 220, the MEMS mirror 190, the light output device 100, the first PCB 310, the second PCB 320, and the FPCB 330. A space may be formed inside the case 500. The sensor 230, the lens barrel 220, the MEMS mirror 190, and the light output device 100 may be arranged in the case 500. In some implementations, the protruding part 221 of the lens barrel 220 may be exposed to the outside of the case 500.

In some implementations, an opening for exposing radiation pins of at least one heat sink 410, 420, 430, or 440 may be formed on at least one surface of the case 500. In some examples, the case 500 may have a rectangular cuboid shape. For example, the case 500 may include a top surface 510, a bottom surface 520, a front surface 530, a rear surface 540, a left side surface, and a right side surface. Openings for exposing radiation pins of at least one heat sink may be formed on four out of six surfaces of the rectangular cuboid shape.

At least one opening may be formed in the case 500. For example, a first opening for exposing radiation pins 411 of the first heat sink 410 to the outside and a second opening for exposing radiation pins 431 of the third heat sink 430 to the outside may be formed on the top surface 510 of the case 500. For example, an opening for exposing radiation pins 432 of the third heat sink 430 may be formed on the bottom surface 520 of the case 500. For example, a first opening 531 for outputting light to the outside, a second opening 532 for exposing the protruding part 221 of the lens barrel 220 to the outside, and a third opening (e.g., a heat sink opening) 533 for exposing radiation pins 441 of the fourth heat sink 440 to the outside may be formed on the front surface 530 of the case 500. For example, an opening for exposing radiation pins 421 of the second heat sink 420 to the outside may be formed on the rear surface 540 of the case 500.

In some implementations, the lidar apparatus 10 may further include a window cover 535. The window cover 535 may cover the first opening 531, and include a filter allowing a light, reflected from the MEMS mirror 190, to pass through the filter. For example, the filter may allow a laser light in an infrared wavelength band to pass therethrough, and block any light in other wavelength bands.

In some implementations, at least one of a width, a length, or an area of the case 500 may correspond to at least one of an area, a width, or a length of each of the heat sinks 410, 420, 430, and 440. For example, sizes of the top surface, the bottom surface, the front surface, and the rear surface of the case 500 may be determined by an area occupied by each of the heat sinks 410, 420, 430, and 440.

The present disclosure as described above may be implemented as software such as a computer code, instructions, or a computer program that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. The scope of the present disclosure should be determined by the reasonable interpretation of the accompanying claims and all changes in the equivalent range of the present disclosure are intended to be included in the scope of the present disclosure.

What is claimed is:

1. A lidar apparatus comprising:
a sensor configured to convert light into an electrical signal;
a light receiving lens configured to receive light and to guide the received light toward the sensor;
a lens barrel that supports the light receiving lens;
a micro-electromechanical systems (MEMS) mirror arranged at a first position in which the MEMS mirror defines a first plane that forms a first acute angle with respect to at least one surface of the lens barrel; and
a light output device that is configured to output a laser light toward the MEMS mirror and that is arranged at a second position in which the light output device defines a second plane that forms a second acute angle with respect to the at least one surface of the lens barrel.

2. The lidar apparatus of claim 1, wherein the light output device comprises:
a laser diode configured to generate first light;
a collimator lens configured to convert the first light into a parallel light; and
a cylindrical lens configured to convert the parallel light into a line light.

3. The lidar apparatus of claim 2, wherein the MEMS mirror is configured to reflect the line light in one or more directions along a scanning direction corresponding to a horizontal direction of the lens barrel.

4. The lidar apparatus of claim 1, further comprising a first Printed Circuit Board (PCB) that is arranged on the MEMS mirror, the first PCB comprising at least one power supply element mounted thereon.

5. The lidar apparatus of claim 4, wherein the light receiving lens comprises a first lens that protrudes forward from a side of the lidar apparatus,
wherein the lens barrel comprises:
a first portion located rearward of the first lens; and
a protrusion part that protrudes forward from the first portion and that supports the first lens of the light receiving lens, and
wherein a front-to-rear length of the first PCB corresponds to a front-to-rear length of the first portion of the lens barrel.

6. The lidar apparatus of claim 4, further comprising a first heat sink that is arranged on the first PCB, the first heat sink comprising a plurality of radiation pins exposed in an upward direction of the lens barrel.

7. The lidar apparatus of claim 6, wherein the first heat sink has a shape corresponding to a shape of the first PCB.

8. The lidar apparatus of claim 4, further comprising a second PCB that is arranged in a direction orthogonal to the first PCB, the second PCB comprising at least one processing element mounted thereon.

9. The lidar apparatus of claim 8, further comprising a second heat sink that is vertically arranged at a rear surface of the second PCB, the second heat sink comprising a plurality of radiation pins exposed in a backward direction of the lens barrel.

10. The lidar apparatus of claim 8, further comprising a Flexible Printed Circuit Board (FPCB) that is configured to electrically connect the second PCB and the light output device to each other.

11. The lidar apparatus of claim 10, further comprising a mirror support that is configured to support the MEMS mirror and the light output device,
wherein at least a portion of the FPCB surrounds the mirror support.

12. The lidar apparatus of claim 10, wherein at least a portion of the FPCB is configured to contact at least one surface of the lens barrel.

13. The lidar apparatus of claim 1, further comprising a third heat sink that is vertically arranged at a rear surface of the sensor, the third heat sink comprising a plurality of radiation pins that extend in a vertical direction with respect to a front-to-rear direction of the lens barrel.

14. The lidar apparatus of claim 13, wherein the plurality of radiation pins of the third heat sink are exposed in an upward direction of the lens barrel and a downward direction of the lens barrel.

15. The lidar apparatus of claim 1, further comprising a fourth heat sink that contacts at least a portion of the light output device, the fourth heat sink comprising a plurality of radiation pins exposed in a forward direction of the lens barrel.

16. The lidar apparatus of claim 1, further comprising a case that defines an exterior appearance of the lidar apparatus and that is configured to accommodate the sensor, the lens barrel, the MEMS mirror, and the light output device, the case defining at least one opening.

17. The lidar apparatus of claim 16, further comprising a window cover that is configured to cover the at least one opening, the window cover comprising a filter that allows light reflected from the MEMS mirror to pass therethrough.

18. The lidar apparatus of claim 16, further comprising at least one heat sink, and
wherein the at least one opening defined in the case comprises a heat sink opening that is configured to expose radiation pins of the at least one heat sink.

19. The lidar apparatus of claim 18, wherein the case has a rectangular cuboid shape having six surfaces,
wherein the at least one heat sink comprises a plurality of heat sinks, and
wherein the at least one opening comprises a plurality of openings that are located at four surfaces among the six surfaces of the case and that are configured to expose radiation pins of the plurality of heat sinks.

20. The lidar apparatus of claim 18, wherein at least one of a width, a length, or an area of the case corresponds to at least one of a width, a length, or an area of the at least one heat sink, respectively.

* * * * *